United States Patent
Zhou et al.

(10) Patent No.: US 10,311,623 B2
(45) Date of Patent: Jun. 4, 2019

(54) REAL-TIME ANIMATION METHOD FOR HAIR-OBJECT COLLISIONS

(71) Applicant: ZHEJIANG UNIVERSITY, Hangzhou, Zhejiang (CN)

(72) Inventors: Kun Zhou, Zhejiang (CN); Menglei Chai, Zhejiang (CN); Changxi Zheng, Zhejiang (CN)

(73) Assignee: ZHEJIANG UNIVERSITY, Hangzhou, Zhejiang (CN)

( * ) Notice: Subject to any disclaimer, the term of this patent is extended or adjusted under 35 U.S.C. 154(b) by 0 days.

(21) Appl. No.: 15/533,297

(22) PCT Filed: Feb. 15, 2015

(86) PCT No.: PCT/CN2015/073081
§ 371 (c)(1),
(2) Date: Jun. 5, 2017

(87) PCT Pub. No.: WO2016/127421
PCT Pub. Date: Aug. 18, 2016

(65) Prior Publication Data
US 2018/0268591 A1    Sep. 20, 2018

(51) Int. Cl.
*G06T 13/40* (2011.01)
*G06F 17/50* (2006.01)

(52) U.S. Cl.
CPC .......... *G06T 13/40* (2013.01); *G06F 17/5009* (2013.01); *G06T 2210/21* (2013.01)

(58) Field of Classification Search
None
See application file for complete search history.

(56) References Cited

U.S. PATENT DOCUMENTS

| | | | |
|---|---|---|---|
| 8,803,887 B2 * | 8/2014 | McAdams | G06T 13/40 345/419 |
| 2014/0198108 A1 * | 7/2014 | Sigal | G06T 13/40 345/474 |

FOREIGN PATENT DOCUMENTS

| | | |
|---|---|---|
| CN | 103942090 | 7/2013 |
| CN | 103942376 | 7/2014 |

* cited by examiner

*Primary Examiner* — Said Broome

(57) ABSTRACT

Disclosed is a real-time motion simulation method for hair and object collisions, which is based on a small amount of pre-computation training data and generates a self-adaptive simplified model for virtual hair style for real-time selection and interpolation and collision correction, thereby realizing real-time high-quality motion simulation for hair-object collisions. The method comprises the following steps: 1) reduced model pre-computation: based on pre-computation simulation data, selecting representative hairs and generating a reduced model; 2) real-time animation and interpolation: clustering the representative hairs simulated in real time; selecting the reduced model and interpolating; and 3) collision correction: detecting collision and applying a correction force on the representative hairs to correct the collisions. The present invention proposed a real-time simulation method for hair-object collision, which achieves similar effect as off-line simulation and reduces the computation time cost.

3 Claims, 2 Drawing Sheets

(a)            (b)            (c)

(a) (b) (c)

(a) (b) (c)

(a) (b) (c) (d)

(a) (b) (c) (d)

REAL-TIME ANIMATION METHOD FOR HAIR-OBJECT COLLISIONS

CROSS REFERENCE OF RELATED APPLICATION

This is a U.S. National Stage under 35 U.S.C 371 of the International Application PCT/CN2015/073081, filed Feb. 15, 2015.

BACKGROUND OF THE PRESENT INVENTION

Field of Invention

The present invention relates to computer-aided virtual object simulation field, and more particularly to a real-time animation method for hairs of virtual character.

Description of Related Arts

The related research background is briefed as follow:
Realistic virtual hair motion modeling and simulation is widely applied in computer animation, virtual reality and etc. From the beginning of the work, when the interactions between hair strands are not taken into consideration, till now the hair animation is always a hot research topic. ((Rosenblum, R. E., Carlson, W. E., and Tripp, E. 1991. Simulating the structure and dynamics of human hair: modelling, rendering and animation. The Journal of Visualization and Computer Animation 2, 4, 141-148.) (Anjyo, K.-I., Usami, Y., and Kurihara, T. 1992. A simple method for extracting the natural beauty of hair. In ACM SIGGRAPH Computer Graphics, vol. 26, ACM, 111-120.), Aiming at high-quality hair animation, the conventional method is to simulate every single hair strand and capture the fine motion details. In order to simulate the hair motion in real world, different animation models aiming at single hair dynamics are proposed by many research projects, such as (Bertails, F., Audoly, B., Cani, M.-P., Querleux, B., Leroy, F., and Leveque, J.-L. 2006. Super-helices for predicting the dynamics of natural hair. In ACM Transactions on Graphics (TOG), vol. 25, ACM, 1180-1187.) (Selle, A., Lentine, M., and Fedkiw, R. 2008. A mass spring model for hair simulation. ACM Trans. Graph. (SIGGRAPH 2008) 27, 3 (August).) (Bergou, M., Wardetzky, M., Robinson, S., Audoly, B., and Grin-spun, E. 2008. Discrete elastic rods. In ACM Transactions on Graphics (TOG), vol. 27, ACM, 63.) (Casati, R., and Bertails-Descoubes, F. 2013. Super space clothoids. ACM Transaction on Graphics.). Based on the hair motion models, many methods which simulate the single hair dynamics and take into account of complex interactions between hair strands are proved to be able to get more realistic results, among which (Selle, A., Lentine, M., and Fedkiw, R. 2008. A mass spring model for hair simulation. ACM Trans. Graph. (SIGGRAPH 2008) 27, 3 (August).) represents hair interactions with hair attraction and geometry collision to realize the hair cluster structure dynamic change; (Mcadams, A., Selle, A., Ward, K., Sifakis, E., and Teran, J. 2009. Detail preserving continuum simulation of straight hair. ACM Transactions on Graphics-TOG 28, 3, 62.) proposed a robust simulation method to simulate the hair interactions, which eases the solution of the geometry collision between large amount of hairs based on fluid collision relaxation; (Daviet, G., Bertails-Descoubes, F., and Boissieux, L. 2011. A hybrid iterative solver for robustly capturing coulomb friction in hair dynamics. In ACM Transactions on Graphics (TOG), vol. 30, ACM, 139.) proposed a hybrid method to robustly simulate the Coulomb's friction between hairs. All the methods are focused on the quality of the effects and needs large amount of offline computing time, which slow down the simulation process tremendously and is not able to be adopted in real-time applications.

Another type of related methods focus on high-efficiency hair animation, which accelerates the simulation and the interaction solution by adopting various simplified representations. One of the commonly used ideas is to deal with the hair interaction implicitly by adopting the fluid which has the characters of volume preserving, local motion similarity and etc. For example, (Hadap, S., and Magnenat-Thalmann, N. 2001. Modeling dynamic hair as a continuum. In Computer Graphics Forum, vol. 20, Wiley Online Library, 329-338.) solves the hair self-collision by adopting fluid simulation model; (Bando, Y., Chen, B.-Y., and Nishita, T. 2003. Animating hair with loosely connected particles. In Computer Graphics Forum, vol. 22, Wiley Online Library, 411-418.) represents hairs with weak correlated particles, the motions of which are simulated through fluid-like method; (Petrovic, L., Henne, M., and Anderson, J. 2005. Volumetric methods for simulation and rendering of hair. Pixar Animation Studios.) aims at animation of stylized hair and simulates interaction by using space body structure to filter the velocity and density of hairs; (Muller, M., Kim, T.-Y., and Chentanez, N. 2012. Fast simulation of inextensible hair and fur. In Workshop on Virtual Reality Interaction and Physical Simulation, The Eurographics Association, 39-44.) adopts similar method to fast simulate hair-hair repulsion; (Mcadams, A., Selle, A., Ward, K., Sifakis, E., and Teran, J. 2009. Detail preserving continuum simulation of straight hair. ACM Transactions on Graphics-TOG 28, 3, 62.) also adopts hybrid fluid solution to strengthen simulation effects.

The idea most related to the present invention is that adopting cluster hair models which represent all realistic hairs concomitance body-fitted grids with interpolations of small amount of guide hairs (Tariq, S., and Bavoil, L. 2008. Real time hair simulation and rendering on the gpu. In ACM SIGGRAPH 2008 talks, ACM, 37.) or with simplifier geometry (such as auxiliary triangle strips (Chang, J. T., Jin, J., and Yu, Y. 2002. A practical model for hair mutual interactions. In Proceedings of the 2002 ACM SIGGRAPH/Eurographics symposium on Computer animation, ACM, 73-80.), cylinder (Choe, B., Choi, M. G., and Ko, H.-S. 2005. Simulating complex hair with robust collision handling. In Proceedings of the 2005 ACM SIGGRAPH/Eurographics symposium on Computer animation, ACM, 153-160.), spheres (Iben, H., Meyer, M., Petrovic, L., Soares, O., Anderson, J., and Witkin, A. 2013. Artistic simulation of curly hair. In Proceedings of the 12th ACM SIGGRAPH/Eurographics Symposium on Computer Animation, ACM, 63-71.)) and so on to deal with the self-collision of hairs. Besides, the self-adaptive hair cluster model (Bertails, F., Kim, T.-Y., Cani, M.-P., and Neumann, U. 2003. Adaptive wisp tree: a multiresolution control structure for simulating dynamic clustering in hair motion. In Proceedings of the 2003 ACM SIGGRAPH/Eurographics symposium on Computer animation, Eurographics Association, 207-213.) (Ward, K., and Lin, M. C. 2003. Adaptive grouping and subdivision for simulating hair dynamics. In Computer Graphics and Applications, 2003. Proceedings. 11th Pacific Conference on, IEEE, 234-243.) (Ward, K., Lin, M. C., Joohi, L., Fisher, S., and Macri, D. 2003. Modeling hair using level-of-detail representations. In Computer Animation and Social Agents, 2003. 16th International Conference on, IEEE, 41-47.) further expends the methods by increasing motion details without trading efficiency in specific situations. All the heuristic models are a compromise between quality and efficiency, which are not able to guarantee similar effects as high precision simulation while reducing computation cost drastically, wherein the quality is usually impaired significantly.

Recently, a real-time hair animation method based on a reduced motion model (Chai, M., Zheng, C., and Zhou, K. 2014. A Reduced Model for Interactive Hairs. ACM Transactions on Graphics, 2014, 33(4)) is able to achieve real-time hair animation but is not able to accurately deal with fine collisions with objects

SUMMARY OF THE PRESENT INVENTION

An object of the present invention is to provide a real-time animation method for hair-object collisions, which is able to overcome the shortages of the conventional technology.

The object of the present invention is realized by the following technical solution: a real-time animation method for hair-object collisions comprises the following steps of:

(1) constructing a reduced model upon pre-computation: selecting representative hairs from an target hair model based on offline animation data; computing all the reduced models based on the representative hairs skinning interpolation;

(2) simulating real-time motions and interpolating: real-time simulating motions of the representative hairs as in the step (1); selecting the reduced model matching scene objects collisions in the step (1); interpolating all hairs and getting the target hair model; and (3) correcting collisions: checking collisions of all the hair strands on the target hair model as in the step (2); applying collision correction on the representative hairs in the step (1) by two-way correction to correct the target hair model; getting all the hairs of the corrected target hair model.

Furthermore, the step (1) comprises the following sub-steps of:

(1.1) recording a training head motion sequence $T_f$ according to the target hair model; simulating motions on the target hair model by adopting a general hair animation technology based on the recorded training head motion sequence $T_f$ and aligning to get a training animation data $H_f$ of the target hair model;

(1.2) getting a set of optimized sparse bases M and a linear combination scalar $\alpha$ by a sparse coding method to reconstruct the training animation data $H_f$ gotten through the step (1.1) approximately and sparsely through a linear combination by the set of sparse base; selecting the same number of the representative hairs G from the target hair model to fit the set of sparse bases; selecting affecting representative hairs $G_s$ of every one of the hairs s on the target hair model from the representative hairs G; and (1.3) constructing reduced model m of every one of the hair strands s on the target hair model by various combinations of $G_s$ using the training animation data $H_f$ gotten from the step (1.1), the representative hairs G and the affecting representative hairs $G_s$ of every one of the hairs on the target hair model gets from the step (1.2); reconstructing the hairs though a skinning interpolation of partial representative hairs $G_s^m$ in $G_s$ by every reduced model; computing a skinning interpolation weight $w_{g \to s}$ of every reduced model by using skinning weight optimization method to optimally fit the hairs reconstructed by using $w_{g \to s}$ with the training animation data $H_f$ of the target hair model.

Furthermore, the step (2) comprises the following sub-steps of:

(2.1) simulating motions of the representative hairs G in the step (1.2) of the target hair model in real-time by using a mass spring model; getting representative hair animation results $G_t$ with consideration of external forces, collisions with the scene objects and interactions between the hairs;

(2.2) calculating a motion similarity d(i,j) which comprises positions and velocities of any pair of representative hairs (i,j) based on the representative hairs animation results $G_t$ of the target hair model in step (2.1); checking collisions with the scene objects on a connecting path between the pair of representative hairs; getting a motion matching between the representative hairs based on the motion similarity and the collisions; clustering the representative hairs according to the motion matching to fit the representative hairs within a cluster with the motion matching;

(2.3) selecting a current reduced model $m_t$ from all the reduced models in the step (1.3) of every one of the hairs on the target hair model, which fits the cluster of the representative hairs and is most approaching to a current reduced model based on the cluster of the representative hairs in the step (2.2); and (2.4) getting a current position of every one of the hairs to get a current state $H_t$ of the target hair model by interpolating the representative hairs animation results in the step (2.1) according to the partial representative hair $G_s^m$ and the interpolation skinning weight $w_{g \to s}$ in the step (1.3) based on the selected reduced model $m_t$ of every one of the hairs on the target hair model in the step (2.3).

Furthermore, the step (3) comprises the following sub-steps of:

(3.1) detecting collision between current positions of every one of the hairs and the scene objects and calculating a correction force $I_s(i)$ which comprises a magnitude and a direction based on the current state $H_t$ of the target hair model in the step (2.4);

(3.2) projecting the correction force $I_s(i)$ of every hair particle of the target hair model in the step (3.1) to the representative hair G of the target hair model in the step (1.2) according to the skinning interpolation weight $w_{g \to s}$ in the current reduced model $m_t$ of the hair in the step (2.3); getting an optimal collision correction force $I^*_g(1)$ of every one of the representative hairs, which is similar to the collision correction force $I_g(1)$ through an interpolation result of the current reduced model; and (3.3) applying the optimal collision correction force $I^*_g(i)$ projected on the representative hairs G of the target hair model in the step (3.2) on a process of animation to relieve collisions between a new target hair model $H^*_t$ and the scene object after interpolating the selected current reduced model of corrected representative hairs according to the step (2.3).

The technical solution of the present invention is summarized as below:

1. Propose an adaptive reduced model for hair-object collision. Precompute hair animation data based on offline simulation; select representative hair and generate self-adaptive reduced model based on skinning interpolation for every hair to rapidly reconstruct target hair model from real-time representative hair animation results according to the reduced model;

2. Provide a real-time selection and interpolation method for reduced model with consideration of collision with objects. Cluster the representative hairs gotten from real-time animation according to the motion state and collision situation; select the reduced model of every hair according to the cluster and interpolation to get the current state of the target hair model which senses collision.

3. A two-way hair-object collision correction method. Detect collision based on the target hair model gotten from interpolation and backward project the collision correction force to the representative hair. After correction, the new target hair model gotten from interpolation is able to relieve the collision situation with the scene object.

The benefits of the present invention are: the computation cost is reduced and the simulation efficiency is improved significantly through constructing the hair motion self-adaptive reduced model, real-time model selection and two-way collision correction, while similar effect with high precision simulation is guaranteed. The present invention proposes a first data-driven real-time hair-object collision animation method aiming at character hair model, which achieves similar effects with full offline simulation while reducing time cost of animation significantly. The present invention is able to realize real-time high-quality collision animation of over 100K hairs of character, which achieves better effects than the conventional methods and has the advantages of high generality, convenient to use and etc.

DETAILED DESCRIPTION OF THE PREFERRED EMBODIMENT

Figure 1:
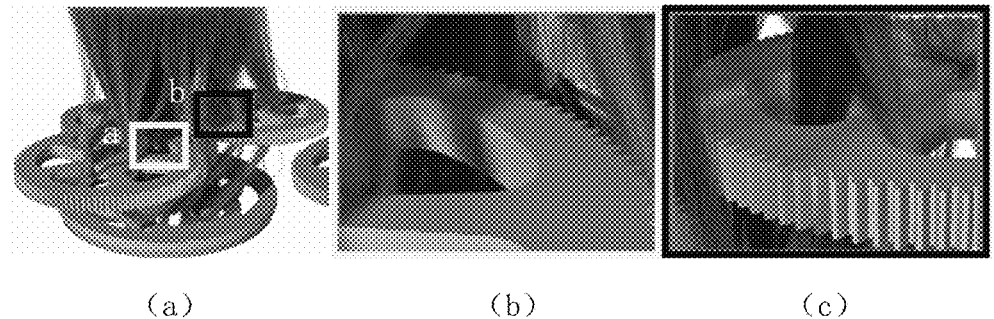
FIG. 1 is a perspective view of a animation result of the present invention and enlarged views of two positions on the animation result, (a) overall view of the result, (b) an enlarged view of the a area marked in (a), (c) an enlarged view of the b area marked in (a)

The core technology of the present invention is to construct a self-adaptive motion reduced model based on training animation data for target hair model to realize on-line model selection and collision correction, therefore achieve high-quality real-time hair-object collision animation.

The present invention provides a real-time animation method for hair-object collisions, comprising the following steps:

(1) Constructing a reduced model upon pre-computation: selecting representative hairs from an target hair model and generating all situations of self-adaptive reduced model for every hair, wherein comprises the following sub-steps:

(1.1) preparing a head motion sequence and generating training animation data of hair: in order to guarantee the variety of the training data, pre-recording 8 head motion sequences about 200 frames in length aiming at target hair model, which is denoted as $T_f$, f is the frame number;

first generating a hair state H* of the static target hair model as a reference state of the hair object; then using a mass spring model (Selle, A., Lentine, M., and Fedkiw, R. 2008. A mass spring model for hair simulation. ACM Trans. Graph. (SIGGRAPH 2008) 27, 3 (August).) for offline high-quality animation of the target hair model to get the training animation data, which is denoted as $H'_f$, f is the frame number based on the head motion sequences in step (1.1); transforming $H'_f$ to align $H'_f$ to the same head position as H*, the final training animation data $H_f$ is $H'_f/T_f$.

(1.2) selecting the representative hairs: selecting the most representative set of sparse bases M from the training simulation data $H_f$ through the following optimal method based on the sparse coding to fit all the training simulation data $H_f$ approximately with the linear combination of the sparse bases; the fitting formula is as below:

$$\arg\min_{M,\alpha} \sum_{s \in \Omega} (\|H - M\alpha_s\|_2^2 + \beta \|\alpha_s\|_1)$$

in the formula, H is a concatenation of training animation data $H_f$ of all the moments; α is the scalar of the linear combination; β is the sparse energy weight; s∈S is any one of the hair object of the target hair object; the optimal number of the present invention for a typical target hair object is 400 of the sparse base M and β adopts a fixed value of 0.15; the present invention adopts method of (Mairal, J., Bach, F., Ponce, J., and Sapiro, G. Online learning for matrix factorization and sparse coding. The Journal of Machine Learning Research 11, 19-60.) to optimally solve the sparse coding problem;

projecting the optimized sparse base M to the nearest hair in H, therefore calculating the hair nearest to every base space of the sparse base M in H to select the representative hair set G; meanwhile, selecting the affecting representative hair $G_s$ of every hair s, which is the corresponding representative hair to all the sparse base whose linear combination scalar is not zero;

(1.3) constructing the reduced model: calculating all the reduced models within the affecting representative hair $G_s$ of every hair s by using the training simulation data in the step (1.2) and the selected representative hair set G; every reduced model corresponding to one combination situation of the representative hairs inside $G_s$, that is to use a partial representative hairs $G_s^m$ in $G_s$ for the reduced model m;

calculating the skinning weights of every representative hair in $G_s^m$ for every reduced model m, therefore the reconstructed particle after interpolation by using the skinning weights is nearest to the position of the particle in all the input hair motion data;

wherein the skinning weight optimal energy is as follow:

$$\min_{w_{g \to s}(i)} \sum_{f=1}^{F} \| \sum_{g \in G_s^m} w_{g \to s}(i) B_g(i, f) \bar{s}_i^* - \bar{s}_i(f) \|_2^2$$

calculating the skinning weight $w_{g \to s}(1)$ for the i th particle on the hair s; wherein $\bar{s}_i(f)$ and $\bar{s}^*_i$ are the particle's position on frame $H_f$ and $H^*$ respectively; $B_g(i,f)$ is a rigid displacement of the guide hair on frame f corresponding to the position on $H^*$; F is the number of all the training motion sequences; meanwhile, adding a following limitation to prevent overfitting:

$$w_{g \to s}(i) \geq 0, \sum_{g \in G_s^m} w_{g \to s}(i) = 1$$

the present method denoting the hair skinning weight as quadratic term coefficients (a,b,c); calculating the skinning weight of every particle by the parameter of the hair as below:

$$w_{g \to s}(i) = ai^2 + bi + c$$

the present method optimizing the quadratic term coefficients as below:

$$\min_{a,b,c} \sum_{i=1}^{N_s} [ai^2 + bi + c - w_{g \to s}(i)]^2$$

$N_s$ is the number of the particles of s;

in order to control the sparsity of the guide hair particles which effect every particle and guarantee the efficiency of the method, adding limitation to limit the number of the guide hair particles which effect every particle to less than K; meanwhile, due to the possibility that after quadratic fitting the sum of the weight $$\sum_{g \in G_s^m} w_{g \to s}(i)$$

is no long is 1, the present method normalizing the calculated skinning weight and the sum of the weight is 1.

Thus, all the reduced models of every hair on the target hair model are achieved.

(2) real-time animation and interpolation: clustering the representative hairs gotten from the real-time animation, selecting the reduced model of every hair and interpolating; wherein comprises the following sub-steps:

(2.1) animation of the representative hairs: simulating the motion of the representative hair G on the target hair model selected in the step 1 to get the current position $G_t$; wherein the present method use the mass spring model while taking into account of the hair-object collision and hair-hair interaction, including hair collision and gravity;

(2.2) selecting the reduced model: calculating the interaction motion similarity d(i,j) of any pair of representative hairs (i,j) by the following formula based on the representative hair animation result $G_t$ calculated in the step (2.1):

$$d(i, j) = \frac{1}{A_{ij}} \| p_i - p_j \|^2 + \frac{\sigma}{B_{ij}} \| v_i - v_j \|^2$$

wherein σ denotes a reciprocal of physical simulation of the time step; p denotes the current position of the representative hair; v denotes the current velocity of the representative hair; $A_{ij}$ and $B_{ij}$ denote the average motion position and velocity migration of the representative hair in the training data respectively:

$$A_{ij} = \frac{1}{F} \sum_{f=1}^{F} \| \tilde{p}_i(f) - \tilde{p}_j(f) \|^2$$

$$B_{ij} = \frac{1}{F} \sum_{f=1}^{F} \| \tilde{v}_i(f) - \tilde{v}_j(f) \|^2$$

meanwhile the present method detecting the collision of any pair of representative hairs (i,j) on the path, therefore to judge whether there is collision between hair i and scene objects on the path of hair i to the position of hair j;

the present method calculating the motion correlation between the representative hairs (i,j) by using the motion similarity d(i,j) and collision relation, wherein when d(i,j) is over a threshold (2 in the present method) and no collision on the path is detected, representative hair (i,j) is considered to be correlated otherwise uncorrelated;

the present invention clustering all the representative hair G to a series of motion correlated subsets by using the correlation; any pair of the representative hair s in every subset is correlated;

projecting the correlated subset of the representative hairs to the representative hair subset $G_s$ of every hair on the target hair object to get the corresponding representative hair dissection; calculating on every dissection to get a corresponding reduced model in the step (1);

the present method selecting a reduced model which is most approaching to the selection of the preceding moment from the corresponding reduced models of the dissections as the current reduced model;

(2.3) interpolation based on the reduced models:
getting the current position $G_t$ based on the step (2.1) and interpolating by using the skinning interpolation weight of the selected reduced model of motion in the step (2.2):

$$\bar{s}_i = \sum_{g \in G_s^m} w_{ig} B_g \bar{s}_i^*$$

The current state of the target hair model is thus achieved.

(3) Collision correction: detecting the collisions between the current state of the target hair model gotten from the interpolation and the scene objects; back projecting the collision correction force to the animation of the representative hairs to relieve the collision situation by the corrected target hair model; wherein comprises the following sub-steps:

(3.1) hair collision detection: detecting the collision between the current state of the target hair model gotten from interpolation in the step 2 and the scene object; calculating the correction force $I_s(i)$ (i th particle on hair s) of all the hair particles, which acts upon the particle and solve collision penetration;

(3.2) calculation of representative hair correction force: the present method optimally transferring the collision correction force of all the hairs calculated in the step (3.1) to the representative hair:

$$\min_{I^*_g, g \in G^m_s} \sum_{s \in C} \sum_{i=1}^{N_s} \| \sum_{g \in G^m_s} w_{g \to s}(i) I^*_g(i) - I_s(i) \|_2^2$$

$I_s(i)$ and $I^*_g(i)$ are the known particle collision correction force of all the hairs and the unknown particle collision correction force of the representative hairs respectively; the present method is optimized by using the standard least square method to solve the particle correction force $I^*_g(i)$ of the representative hair; after projecting to all the hairs through reduced models, $I^*_g(i)$ is able to approaching the particle collision correction force of all the original hairs for the collision particles and has the possible least impact on the non-collision particles;

(3.3) the application of the collision correction force: applying the representative hair collision correction force $I^*_g(i)$ in the step (3.2) as an external force on the representative hairs of the target hair model; simulating by using the standard animation method to correct the collision penetration by the new target hair model gotten from interpolation of the renewed representative hair by using the selected current reduced model, which is the final animation result of the current moment.

EMBODIMENTS

To realize an embodiment of the present invention on a machine has a Intel Core i7-3770 central processing unit, a NVidia GTX760 graphics processing unit and 32 GB memory. The experiment result shown in the figurations is achieved by using all the parameters listed in the specific embodiment methods. The result shows that the hair model is formed by single hairs. Every single hair is denoted with a line segment formed by 20 to 25 particles. During the practical rendering process, the hairs are expanded to polystrips aligned with the screen through the geometry shader for real-time rendering with taking into account of the environment illumination and shade.

Figure 2:
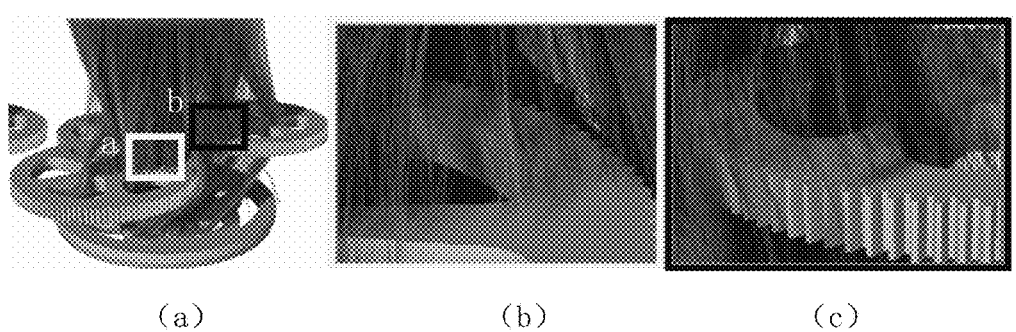
FIG. 2 is a perspective view of a animation result of the conventional method and enlarged views of two positions on the animation result, (a) overall view of the result, (b) an enlarged view of the a area marked in (a), (c) an enlarged view of the b area marked in (a)

As illustrated in FIG. 1 and FIG. 2, compared to the conventional method the present method is able to deal with the hair-object collision properly and solve the hair-object penetration.

Figure 3:
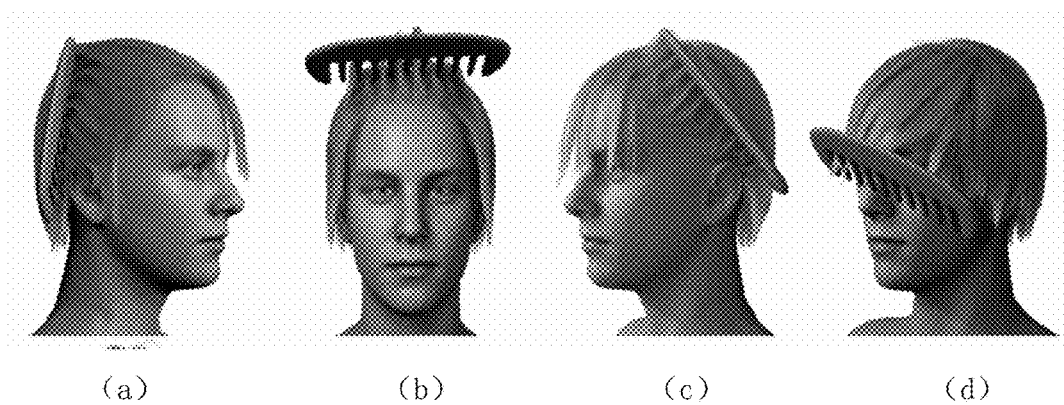
FIG. 3 is a perspective view of the result of an application of the present invention on real-time interaction simulation of straight hair model of character, the results of the four embodiments are shown in (a), (b), (c) and (d) respectively.
Figure 4:
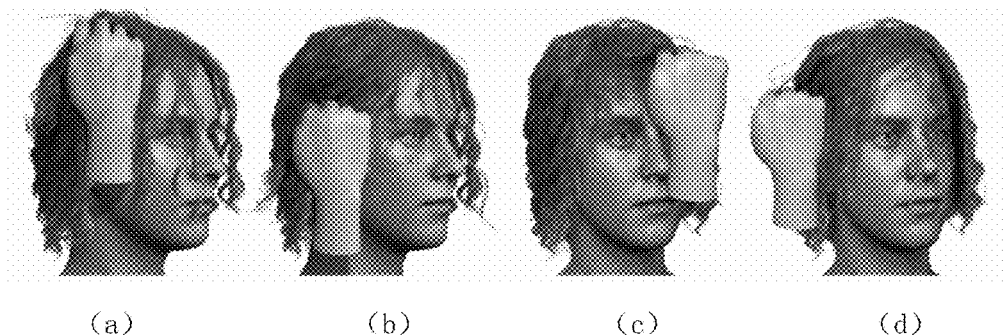
FIG. 4 is a perspective view of the result of an application of the present invention on real-time interaction simulation of curved hair model of character, the results of the four embodiments are shown in (a), (b), (c) and (d) respectively.

Experiment on various hair styles including the straight hairs as illustrated in FIG. 3 and curved hairs as illustrated in FIG. 4. The results show that the present invention is able to be well applied on various hair style models and guarantees good efficiency. For hair styles over 100K hairs, an operational speed of 20 frames per second is guaranteed and a similar effect as high-precision offline animation is achieved.

What is claimed is:

1. A real-time animation method for hair-object collisions, comprising steps of:
   (1) constructing a reduced model upon pre-computation: selecting representative hairs from an target hair model based on offline animation data; computing all the reduced models based on a representative hairs skinning interpolation;
   wherein the step (1) comprises the following sub-steps of:
   (1.1) recording a training head motion sequence $T_f$ according to the target hair model; simulating motions on the target hair model by adopting a general hair animation technology based on the recorded training head motion sequence $T_f$ and aligning to get a training animation data $H_f$ of the target hair model;
   (1.2) getting a set of optimized sparse bases M and a linear combination scalar α by a sparse coding method to reconstruct the training animation data $H_f$ gotten through the step (1.1) approximately and sparsely through a linear combination by the set of sparse base; selecting the same number of the representative hairs G from the target hair model to fit the set of sparse bases; selecting affecting representative hairs $G_s$ of every one of the hairs s on the target hair model from the representative hairs G; and
   (1.3) constructing reduced model m of every one of the hairs s on the target hair model by various combinations of $G_s$ using the training animation data $H_f$ gotten from the step (1.1), the representative hairs G and the affecting representative hairs $G_s$ of every one of the hairs on the target hair model gotten from the step (1.2); reconstructing the hairs though a skinning interpolation of partial representative hairs $G_s^m$ in $G_s$ by every reduced model; computing a skinning interpolation weight $w_{g \to s}$ of every reduced model by using skinning weight optimal method to most fit the hairs reconstructed by using $w_{g \to s}$ with the training animation data $H_f$ of the target hair model;
   (2) simulating real-time motions and interpolating: real-time simulating a motion of the representative hairs as in the step (1); selecting the reduced model matching scene objects collisions in the step (1); interpolating all hairs and getting the target hair model; and
   (3) correcting collisions: checking collisions of all the hairs on the target hair model as in the step (2); applying collision correction on the representative hairs in the step (1) by two-way correction to correct the target hair model; getting all the hairs of the corrected target hair model.

2. The real-time animation method for the hair-object collisions, as recited in claim 1, wherein the step (2) comprises the following sub-steps of:
   (2.1) simulating motions of the representative hairs G in the step (1.2) of the target hair model in real-time by using a mass spring model; getting representative hair animation results $G_t$ with consideration of external forces, collisions with the scene objects and interactions between the hairs;
   (2.2) calculating a motion similarity d(i,j) which comprises positions and velocities of any pair of representative hairs (i,j) based on the representative hairs animation results $G_t$ of the target hair model in step (2.1); checking collisions with the scene objects on a connecting path between the pair of representative hairs; getting a motion matching between the representative hairs based on the motion similarity and the collisions; clustering the representative hairs according to the motion matching to fit the representative hairs within a cluster to the motion matching;
   (2.3) selecting a current reduced model $m_t$ from all the reduced models in the step (1.3) of every one of the hairs on the target hair model, which fit the cluster of the representative hairs and most approaching to a current reduced model based on the cluster of the representative hairs in the step (2.2); and
   (2.4) getting a current position of every one of the hairs to get a current state $H_t$ of the target hair model by interpolating the representative hairs animation results in the step (2.1) according to the partial representative hair $G_s^m$ and the interpolation skinning weight $w_{g \to s}$ in the step (1.3) based on the selected reduced model $m_t$ of every one of the hairs on the target hair model in the step (2.3).

3. The real-time animation method for the hair-object collisions, as recited in claim 2, wherein the step (3) comprises the following sub-steps of:
- (3.1) detecting collision between current positions of every one of the hairs and the scene objects and calculating a correction force $I_s(i)$ which comprises a magnitude and a direction based on the current state $H_t$ of the target hair model in the step (2.4);
- (3.2) projecting the correction force $I_t(i)$ of every hair particle of the target hair model in the step (3.1) to the representative hair G of the target hair model in the step (1.2) according to the skinning interpolation weight $w_{g \to s}$ in the current reduced model $m_t$ of the hair in the step (2.3); getting an optimal collision correction force $I^*_g(i)$ of every one of the representative hairs, which is similar to the collision correction force $I_s(i)$ through an interpolation result of the current reduced model; and
- (3.3) applying the optimal collision correction force $I^*_g(i)$ projected on the representative hairs G of the target hair model in the step (3.2) on a process of animation to relieve collisions between a new target hair model $H^*_t$ and the scene object after interpolating the selected current reduced model of corrected representative hairs according to the step (2.3).

\* \* \* \* \*